(12) United States Patent
More et al.

(10) Patent No.: US 10,164,100 B2
(45) Date of Patent: Dec. 25, 2018

(54) FORMATION METHOD AND STRUCTURE SEMICONDUCTOR DEVICE WITH SOURCE/DRAIN STRUCTURES

(71) Applicant: TAIWAN SEMICONDUCTOR MANUFACTURING CO., LTD., Hsinchu (TW)

(72) Inventors: Shahaji B. More, Hsinchu (TW); Zheng-Yang Pan, Zhubei (TW); Chun-Chieh Wang, Kaohsiung (TW); Cheng-Han Lee, New Taipei (TW); Shih-Chieh Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/004,727

(22) Filed: Jun. 11, 2018

(65) Prior Publication Data

US 2018/0294357 A1    Oct. 11, 2018

Related U.S. Application Data

(63) Continuation of application No. 15/292,428, filed on Oct. 13, 2016, now Pat. No. 10,026,840.

(51) Int. Cl.
| | | |
|---|---|---|
| H01L 29/417 | (2006.01) | |
| H01L 29/78 | (2006.01) | |
| H01L 29/08 | (2006.01) | |
| H01L 29/267 | (2006.01) | |
| H01L 29/36 | (2006.01) | |
| H01L 27/092 | (2006.01) | |
| H01L 21/8238 | (2006.01) | |

(Continued)

(52) U.S. Cl.
CPC .. *H01L 29/7848* (2013.01); *H01L 21/823418* (2013.01); *H01L 21/823814* (2013.01); *H01L 27/092* (2013.01); *H01L 29/0847* (2013.01); *H01L 29/165* (2013.01); *H01L 29/267* (2013.01); *H01L 29/36* (2013.01); *H01L 29/41783* (2013.01); *H01L 29/665* (2013.01); *H01L 29/66636* (2013.01); *H01L 29/7834* (2013.01)

(58) Field of Classification Search
CPC ..... H01L 21/823418; H01L 21/823814; H01L 29/0847; H01L 29/086; H01L 29/0878; H01L 29/36; H01L 29/41766; H01L 29/41783; H01L 29/66636; H01L 29/7845; H01L 29/7848
See application file for complete search history.

(56) References Cited

U.S. PATENT DOCUMENTS 7,667,271 B2    2/2010 Yu et al.
8,362,575 B2    1/2013 Kwok et al.
(Continued)

*Primary Examiner* — Stephen W Smoot
(74) *Attorney, Agent, or Firm* — Birch, Stewart, Kolasch & Birch, LLP

(57) ABSTRACT

Structures and formation methods of a semiconductor device are provided. The semiconductor device structure includes a substrate and a gate structure over the substrate. The semiconductor device structure also includes a source/drain structure near the gate structure. The source/drain structure has an inner portion and an outer portion surrounding an entirety of the inner portion. The inner portion has a greater average dopant concentration than that of the outer portion.

20 Claims, 5 Drawing Sheets

(51) Int. Cl.
    *H01L 29/66*     (2006.01)
    *H01L 21/8234*     (2006.01)
    *H01L 29/165*     (2006.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,735,057 B2 * | 8/2017 | Shintri ............ H01L 21/823418 |
| 9,812,569 B2 * | 11/2017 | Chen .................... H01L 29/7848 |
| 9,972,682 B2 * | 5/2018 | Gluschenkov ...... H01L 29/0847 |
| 2011/0057270 A1 | 3/2011 | Nishikawa |
| 2011/0068407 A1 | 3/2011 | Yeh et al. |
| 2013/0011983 A1 | 1/2013 | Tsai et al. |
| 2014/0252412 A1 | 9/2014 | Tsai et al. |
| 2015/0255578 A1* | 9/2015 | Chang ................. H01L 29/7848 |
| | | 257/343 |

* cited by examiner

FORMATION METHOD AND STRUCTURE SEMICONDUCTOR DEVICE WITH SOURCE/DRAIN STRUCTURES

CROSS REFERENCE

This application is a Continuation application of U.S. patent application Ser. No. 15/292,428, filed on Oct. 13, 2016, the entire of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
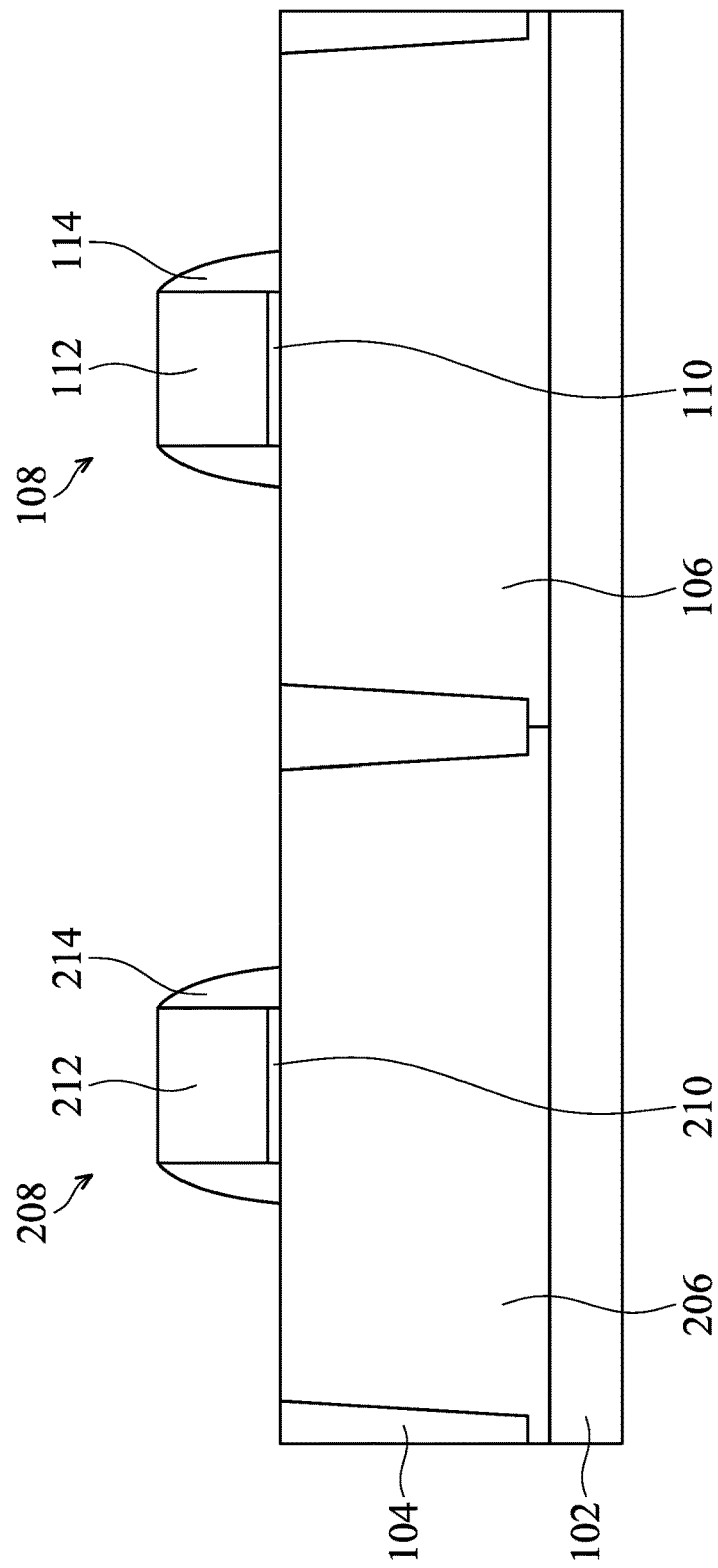
FIGS. 1A-1D are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIGS. 1A-1D are cross-sectional views of various stages of a process for forming a semiconductor device including an N-type metal-oxide-semiconductor (NMOS) and a P-type metal-oxide-semiconductor (PMOS), in accordance with some embodiments. As shown in FIG. 1A, a semiconductor substrate 102 is received or provided, in accordance with some embodiments. In some embodiments, the semiconductor substrate 102 is a bulk semiconductor substrate, such as a semiconductor wafer. For example, the semiconductor substrate 102 is a silicon wafer. The semiconductor substrate 102 may include silicon or another elementary semiconductor material such as germanium. In some other embodiments, the semiconductor substrate 102 includes a compound semiconductor. The compound semiconductor may include gallium arsenide, silicon carbide, indium arsenide, indium phosphide, another suitable material, or a combination thereof.

In some embodiments, the semiconductor substrate 102 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 102 is an un-doped substrate. However, in some other embodiments, the semiconductor substrate 102 may be a doped substrate such as a P-type substrate or an N-type substrate.

In some embodiments, isolation structures 104 are formed in the semiconductor substrate 102 to define various active regions in the semiconductor substrate 102. The isolation structures 104 electrically isolate neighboring devices (e.g., transistors) from one another. The isolation structures 104 include, for example, a silicon oxide, silicon nitride, silicon oxynitride, fluoride-doped silicate glass (FSG), a low-K dielectric material, other suitable materials, or a combination thereof. The isolation structures 104 may be formed by using an isolation technology, such as local oxidation of semiconductor (LOCOS), shallow trench isolation (STI), or the like. In some embodiments, the formation of the isolation structures 104 includes patterning the semiconductor substrate 102 by a photolithography process, etching a trench in the semiconductor substrate 102 (for example, by using a dry etching process, a wet etching process, a plasma etching process, or a combination thereof), and filling the trench (for example, by using a chemical vapor deposition process) with a dielectric material. In some embodiments, the filled trench has a multi-layer structure, such as a thermal oxide liner layer filled with silicon nitride or silicon oxide.

In some embodiments, a P-well region 106 and an N-well region 206 are formed sequentially in the semiconductor substrate 102, as shown in FIG. 1A. In some embodiments, separate ion implantation processes are performed to form the P-well region 106 and the N-well region 206, respectively. By using two different implantation mask layers, the P-well region 106 and the N-well region 206 are sequentially formed in different ion implantation processes.

In some embodiments, a first implantation mask layer (not shown) is used to cover a portion of the semiconductor substrate 102. The first implantation mask layer has an opening which exposes another portion of the semiconductor substrate 102. In some embodiments, the first implantation mask layer is a patterned photoresist layer. In some other embodiments, the first implantation mask layer is a patterned dielectric layer, such as a silicon nitride layer. Afterwards, a first ion implantation process is performed on the exposed portion of the semiconductor substrate 102 to form a well region such as the P-well region 106. For example, P-type dopants such as boron or $BF_2$ are implanted into the exposed portion of the semiconductor substrate 102 to form the P-well region 106. The first implantation mask layer is then removed.

Afterwards, a second implantation mask layer (not shown) is used to cover the P-well region 106 in some embodiments. The second implantation mask layer has an opening which exposes the portion of the semiconductor substrate 102 previously covered by the first implantation mask layer. In some embodiments, the second implantation mask layer is a patterned photoresist layer. In some other embodiments, the second implantation mask layer is a patterned dielectric layer, such as a silicon nitride layer. Afterwards, a second ion implantation process is performed to form a well region such as the N-well region 206. For example, N-type dopants such as phosphor or arsenic are implanted into the exposed portion of the semiconductor substrate 102 to form the N-well region 206.

Afterwards, an annealing process is performed to drive in the implanted dopants in some embodiments. In some other embodiments, the N-well region 206 is formed before the P-well region 106. In some other embodiments, the P-well region is not formed if the semiconductor substrate 102 is a P-type semiconductor substrate. In some other embodiments, the N-well region is not formed if the semiconductor substrate 102 is an N-type semiconductor substrate.

As shown in FIG. 1A, two or more gate structures are formed over the semiconductor substrate 102, in accordance with some embodiments. For example, in some embodiments of the present disclosure, a gate structure 108 is formed over the P-well region 106 of the semiconductor substrate 102, and a gate structure 208 is formed over the N-well region 206 of the semiconductor substrate 102.

As shown in FIG. 1A, the gate structure 108 includes a gate dielectric layer 110 over the P-well region 106 of the semiconductor substrate 102 and a gate electrode 112 over the gate dielectric layer 110, in accordance with some embodiments. In addition, as shown in FIG. 1A, the gate structure 208 includes a gate dielectric layer 210 over the N-well region 206 of the semiconductor substrate 102 and a gate electrode 212 over the gate dielectric layer 210, in accordance with some embodiments.

In some embodiments, each of the gate dielectric layers 110 and 210 is made of silicon oxide, silicon nitride, silicon oxynitride, high-k material, any other suitable dielectric material, or a combination thereof. In some embodiments of the present disclosure, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof.

In some embodiments, each of the gate electrodes 112 and 212 is made of polysilicon, a metal material, another suitable conductive material, or a combination thereof. In some embodiments of the present disclosure, the metal material may include, but is not limited to, copper, aluminum, tungsten, molybdenum, titanium, tantalum, platinum, or hafnium. In some embodiments, the gate electrode 112 and/or 212 is a dummy gate electrode and will be replaced with another conductive material such as a metal material. The dummy gate electrode layer is made of, for example, polysilicon.

In some embodiments, a gate dielectric material layer (not shown) and a gate electrode material layer (not shown) are sequentially deposited over the semiconductor substrate 102. In some embodiments, the gate dielectric material layer and the gate electrode material layer are sequentially deposited by using suitable deposition methods. In some embodiments of the present disclosure, the suitable deposition methods for depositing the gate dielectric material layer may include a chemical vapor deposition (CVD) process, an atomic layer deposition (ALD) process, a thermal oxidation process, a spin-on coating process, another applicable process, or a combination thereof. In some embodiments of the present disclosure, the suitable deposition methods for depositing the gate electrode material layer may include a chemical vapor deposition (CVD), a physical vapor deposition (PVD) process, or any other suitable methods.

Afterwards, according to some embodiments of the present disclosure, the gate dielectric material layer and the gate electrode material layer are patterned to form the gate structure 108 including the gate dielectric layer 110 and the gate electrode 112, and form the gate structure 208 including the gate dielectric layer 210 and the gate electrode 212.

As shown in FIG. 1A, spacer elements 114 are formed over sidewalls of the gate structure 108, in accordance with some embodiments. In addition, as shown in FIG. 1A, spacer elements 214 are formed over sidewalls of the gate structure 208, in accordance with some embodiments. In some embodiments, the spacer elements 114 and 214 are made of silicon nitride, silicon oxynitride, silicon carbide, another suitable material, or a combination thereof.

In some embodiments, a spacer layer is deposited over the semiconductor substrate 102 and the gate structures 108 and 208. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the gate structure 108 form the spacer elements 114, and the remaining portions of the spacer layer over the sidewalls of the gate structure 208 form the spacer elements 214.

Figure 1B:
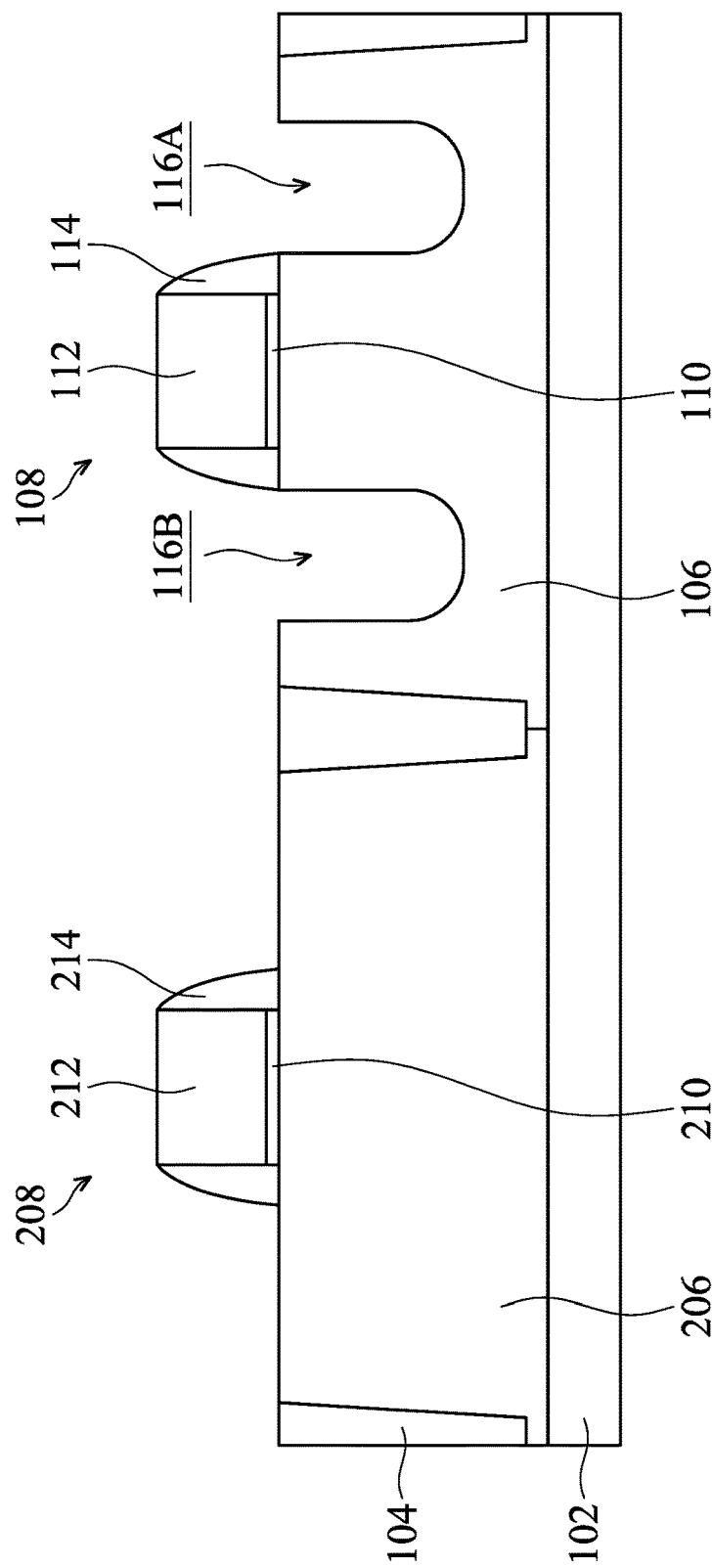

As shown in FIG. 1B, a portion of the semiconductor substrate 102 is removed to form a first recess 116A and a second recess 116B in the P-well region 106 of the semiconductor substrate 102, in accordance with some embodiments. As shown in FIG. 1B, the first recess 116A and the second recess 116B extend into the P-well region 106 from a surface of the semiconductor substrate 102, in accordance with some embodiments. As shown in FIG. 1B, the first recess 116A and the second recess 116B are at opposite sides of the gate structure 108 and adjacent to the gate structure 108. In some embodiments, a photolithography process and an etching process are performed to form the first recess 116A and the second recess 116B.

Figure 1C:
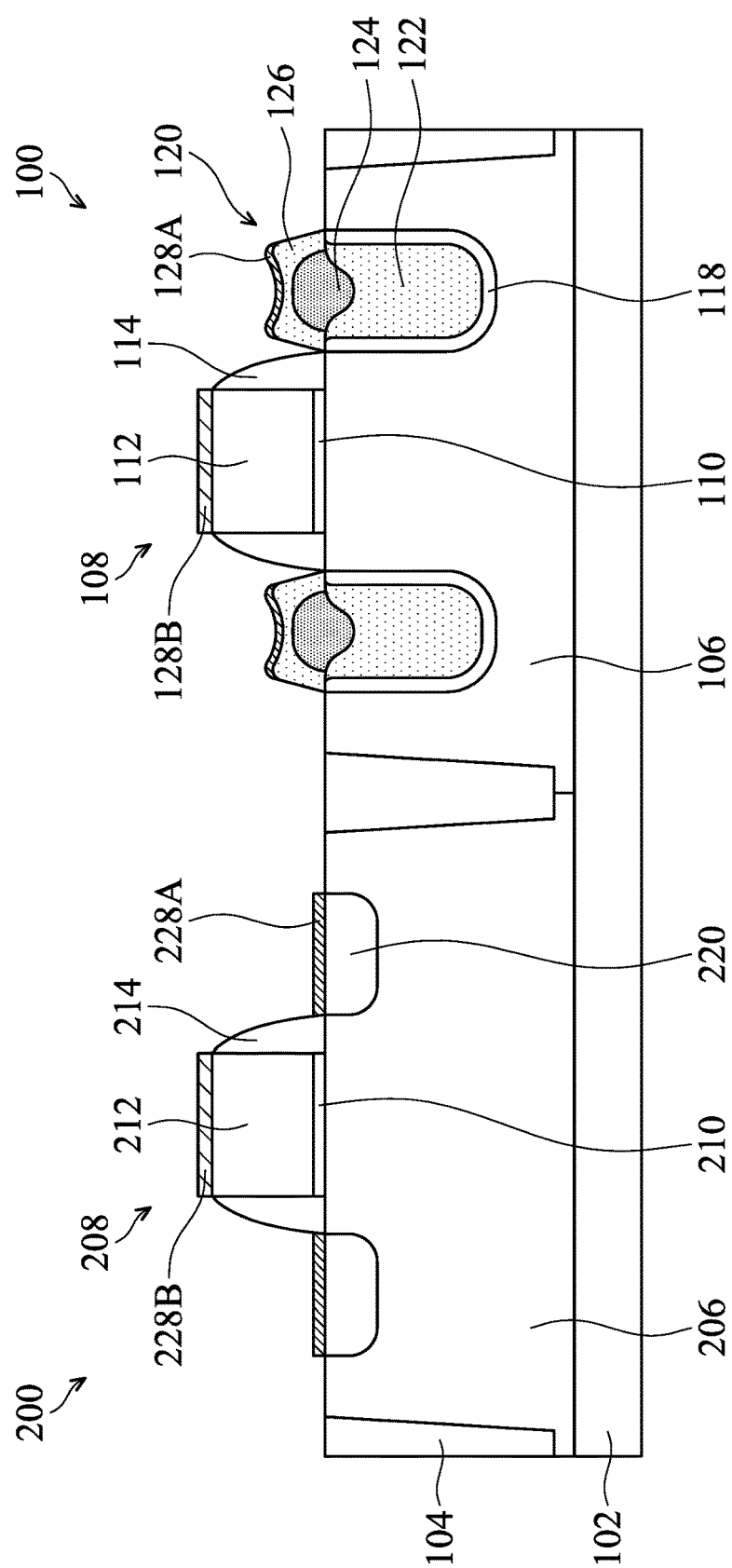

As shown in FIG. 1C, a liner layer 118 is conformally formed over the sidewalls of the first recess 116A and the second recess 116B, in accordance with some embodiments. In some embodiments, the liner layer 118 is an n-type semiconductor material. The liner layer 118 may include epitaxially grown silicon, epitaxially grown silicon phosphide (SiP), or another suitable epitaxially grown semiconductor material.

In some embodiments, a semiconductor material is epitaxially grown in the recesses 116A and 116B to form the liner layer 118. In particular, in some embodiments, the liner layer 118 is formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the liner layer 118 may use gaseous and/or liquid precursors.

In some embodiments, the liner layer 118 is doped with one or more suitable dopants. For example, the liner layer 118 is a Si liner layer doped with phosphor (P) or another suitable dopant. In some embodiments, the liner layer 118 is doped in-situ during the growth of the liner layer 118.

As shown in FIG. 1C, two source/drain structures 120 are over the first recess 116A and the second recess 116B respectively to form an NMOS 100, in accordance with some embodiments. In some embodiments of the present disclosure, as shown in FIG. 1C, the source/drain structure 120 is formed over the liner layer 118 in the first recess 116A and the second recess 116B.

As shown in FIG. 1C, at least one of the source/drain structures 120 includes a first doped region 122 over the liner layer 118, a second doped region 124 over the first doped region 122, and a third doped region 126 over the second doped region 124, in accordance with some embodiments.

As shown in FIG. 1C, the first doped region 122 partially fills in the recesses 116A and 116B. In addition, as shown in FIG. 1C, a portion of the second doped region 124 fills in the recesses 116A and 116B, whereas another portion of the second doped region 124 protrudes from the recesses 116A and 116B, in accordance with some embodiments. In addition, as shown in FIG. 1C, the third doped region 126 is positioned over and outside the recesses 116A and 116B, in accordance with some embodiments.

In some embodiments of the present disclosure, the first doped region 122, the second doped region 124 and the third doped region 126 may also be referred to as a first doped layer 122, a second doped layer 124 and a third doped layer 126, respectively.

In addition, as shown in FIG. 1C, the liner layer 118 is between the first doped region 122 and the sidewall of the recesses 116A and 116B, in accordance with some embodiments.

In some embodiments, the source/drain structures 120 may alternatively be referred to as raised source and drain structures. In some embodiments, the source/drain structures 120 are strained structures. The source/drain structures 120 impart stress or strain to the channel region under the gate structure 108 to enhance the carrier mobility of the device and improve device performance.

In some embodiments, each of the first doped region 122, the second doped region 124 and the third doped region 126 of the source/drain structures 120 is made of an n-type semiconductor material. In some embodiments, each of the first doped region 122, the second doped region 124 and the third doped region 126 of the source/drain structures 120 may be made of epitaxially grown SiP, epitaxially grown SiAs, epitaxially grown SiCP, epitaxially grown SiCAs, or another suitable epitaxially grown semiconductor material, or a combination thereof.

In some embodiments, a semiconductor material is epitaxially grown over the liner layer 118 in the recesses 116A and 116B and continues to grow to above the recesses 116A and 116B to form the source/drain structures 120.

In particular, in some embodiments, the first doped region 122, the second doped region 124 and the third doped region 126 of the source/drain structures 120 are formed by using a selective epitaxial growth (SEG) process, a molecular beam epitaxy process, a CVD process (e.g., a vapor-phase epitaxy (VPE) process, a low pressure chemical vapor deposition (LPCVD) process, and/or an ultra-high vacuum CVD (UHV-CVD) process) with an optional etching process, another applicable process, or a combination thereof. The formation process of the first doped region 122, the second doped region 124 and the third doped region 126 of the source/drain structures 120 may use gaseous and/or liquid precursors.

In some embodiments, each of the first doped region 122, the second doped region 124 and the third doped region 126 of the source/drain structures 120 is doped with one or more suitable dopants. For example, each of the first doped region 122, the second doped region 124 and the third doped region 126 of the source/drain structures 120 is a Si layer doped with phosphor (P), arsenic (As), or another suitable dopant.

In some embodiments, each of the first doped region 122, the second doped region 124 and the third doped region 126 of the source/drain structures 120 is doped in-situ during the growth process.

In addition, as shown in FIG. 1C, in some embodiments of the present disclosure, a groove is formed at the top surface of the third doped region 126. In some embodiments, the groove is formed by using a photolithography process and an etching process.

In addition, in some embodiments, the source/drain structures 120 and the liner layer 118 are further exposed to annealing processes to activate the dopants. For example, a rapid thermal annealing process is performed.

In some embodiments of the present disclosure, the second doped region 124 contains more dopants such as phosphor (P) or arsenic (As) than the first doped region 122 and/or the third doped region 126. In other words, in some embodiments of the present disclosure, the dopant concentration of the second doped region 124 is higher than the dopant concentration of the first doped region 122 and/or the dopant concentration of the third doped region 126. In some embodiments, the dopant concentration is the concentration of phosphor (P) or arsenic (As).

In some embodiments, the ratio of the dopant concentration of the second doped region 124 to the dopant concentration of the third doped region 126 is in a range from about 2:1 to 1.3:1, for example about 1.8:1 to 1.5:1.

In some cases, if the ratio is too high, for example higher than about 2:1, the difference between the dopant concentration of the second doped region 124 and the dopant concentration of the third doped region 126 would be too large, and the electrical quality of the semiconductor device might be negatively affected. In some other cases, if the ratio is too low, for example less than about 1.3:1, the dopant concentration of the third doped region 126 would be too large, and the electrical quality of the semiconductor device might also be negatively affected.

In some embodiments, the ratio of the dopant concentration of the second doped region 124 to the dopant concentration of the first doped region 122 is in a range from about 3:1 to 1.3:1, for example about 2:1 to 1.5:1.

In some cases, if the ratio is too high, for example higher than about 3:1, the difference between the dopant concentration of the second doped region 124 and the dopant concentration of the first doped region 122 would be too large, and the electrical quality of the semiconductor device might be negatively affected. In some other cases, if the ratio is too low, for example less than about 1.3:1, the dopant concentration of the first doped region 122 would be too large, and the electrical quality of the semiconductor device might also be negatively affected.

In addition, in some embodiments, the dopant concentration of the third doped region 126 is higher than or equal to the dopant concentration of the first doped region 122.

In some embodiments of the present disclosure, the dopant concentration of the first doped region 122 is in a range from about $2\times10^{21}/cm^3$ to about $4\times10^{21}/cm^3$, for example about $3\times10^{21}/cm^3$. In some embodiments of the present disclosure, the dopant concentration of the second doped region 124 is in a range from about $3\times10^{21}/cm^3$ to about $5\times10^{21}/cm^3$, for example about $4\times10^{21}/cm^3$. In some embodiments of the present disclosure, the dopant concentration of the third doped region 126 is in a range from about $2\times10^{21}/cm^3$ to about $4\times10^{21}/cm^3$, for example about $3\times10^{21}/cm^3$. In some embodiments of the present disclosure, the dopant concentration refers to the average dopant concentration or the equilibrium dopant concentration of each region.

In some embodiments of the present disclosure, the dopant concentration of the liner layer 118 is less than the dopant concentration of the first doped region 122. In some embodiments of the present disclosure, the dopant concentration of the liner layer 118 is in a range from about $5\times10^{19}/cm^3$ to about $1.5\times10^{21}/cm^3$, for example about $1\times10^{20}/cm^3$. In some embodiments of the present disclosure, the dopant concentration refers to the average dopant concentration or the equilibrium dopant concentration of the liner layer.

In some embodiments of the present disclosure, the second doped region 124 which has the highest dopant concentration in the source/drain structure 120 is referred to as a heavily-doped region, whereas the first doped region 122 and the third doped region 126 are together referred to as a lightly-doped region in the source/drain structure 120. As shown in FIG. 1C, the second doped region 124 is enclosed by the first doped region 122 and the third doped region 126, in accordance with some embodiments. In other words, in some embodiments, the heavily-doped region 124 of the source/drain structure 120 is enclosed by the lightly-doped region, which is formed by the first doped region 122 and the third doped region 126.

As shown in FIG. 1C, since the second doped region 124 is enclosed by the first doped region 122 and the third doped region 126, the second doped region 124 is only in direct contact with the first doped region 122 and the third doped region 126, in accordance with some embodiments. As shown in FIG. 1C, the second doped region 124 does not come into contact with the liner layer 118 and substrate 102, in accordance with some embodiments.

In some embodiments of the present disclosure, the third doped region 126 may alternatively be referred to as an upper portion 126 of the lightly-doped region, whereas the first doped region 122 may alternatively be referred to as a lower portion 122 of the lightly-doped region.

As shown in FIG. 1C, the third doped region 126 covers the top surface of the second doped region 124, in accordance with some embodiments. In addition, as shown in FIG. 1C, the first doped region 122 covers the bottom surface of the second doped region 124, in accordance with some embodiments.

As shown in FIG. 1C, the third doped region 126 is in direct contact with the liner layer 118, the first doped region 122 and the second doped region 124, in accordance with some embodiments. In addition, as shown in FIG. 1C, the third doped region 126 does not come into contact with the semiconductor substrate 102.

As shown in FIG. 1C, the second doped region 124 is separated from the sidewall of the recesses 116A and 116B by the first doped region 122 and the liner layer 118. In some cases, since the second doped region 124, which has the highest dopant concentration in the source/drain structure 120, is separated from the sidewall of the recesses 116A and 116B by the first doped region 122 and the liner layer 118, which have lower dopant concentrations, the current leakage from the second doped region 124 to the channel region under the gate structure 108 may be reduced.

In addition, in some cases, when the third doped region 126 is formed by CVD and etching processes, the etching selectivity of the third doped region 126 may be improved due to the lower dopant concentration of the third doped region 126.

As shown in FIG. 1C, the first doped region 122 is in direct contact with the liner layer 118, the second doped region 124 and the third doped region 126, in accordance with some embodiments. In addition, as shown in FIG. 1C, the first doped region 122 is separated from the sidewall of the recesses 116A and 116B by the liner layer 118, in accordance with some embodiments.

In some cases, since the first doped region 122 is separated from the sidewall of the recesses 116A and 116B by the liner layer 118 which has a dopant concentration less than that of the first doped region 122, the current leakage from the first doped region 122 to the channel region under the gate structure 108 may be reduced. As shown in FIG. 1C, the first doped region 122 does not come into contact with the semiconductor substrate 102, in accordance with some embodiments.

Subsequently, two source/drain regions 220 are formed in the N-well region 206 of the semiconductor substrate 102 to form a PMOS 200, as shown in FIG. 1C in accordance with some embodiments. In some embodiments, an implantation mask layer (not shown) is used to cover the P-well region 106. Afterwards, an implantation process is performed, also with the gate structure 208 as an implantation mask, to form the source/drain regions 220. In some embodiments, P-type dopants are implanted into the N-well region 206 to form the source/drain regions 220, without being implanted into the P-well region 106.

The source/drain regions 220 are respectively on opposite sides of the gate structure 208 and in the semiconductor substrate 102. In some embodiments, a portion of the source/drain regions 220 is near the gate structure 208 and underneath the spacer elements 214. In some embodiments, the implantation processes are performed at a tilt angle such that the formed source/drain regions 220 extend under the gate structure 208, respectively.

After the source/drain regions 220 are formed, the implantation mask layer is removed. Afterwards, an annealing process, such as a rapid thermal process (RTP), may be performed to repair the crystal structure of the silicon in the source/drain regions 220 and activate the dopant in the source/drain regions 220.

Embodiments of the disclosure have many variations. For example, in some embodiments, the source/drain regions 220 are not covered by the spacer elements 214. In some other embodiments, the source/drain regions 220 further extend under the gate structure 208 and are covered by the gate structure 208.

In some embodiments, the first recess 116A, the second recess 116B and the source/drain structures 120 which includes the first doped region 122, the second doped region 124 and the third doped region 126 are formed before the source/drain regions 220 are formed. However, in some other embodiments, the first recess 116A, the second recess 116B and the source/drain structures 120 are formed after the source/drain regions 220 are formed.

As shown in FIG. 1C, a metal-semiconductor compound layer 128A is formed over the groove of the third doped region 126 of the source/drain structure 120, and a metal-semiconductor compound layer 128B is formed over the gate structure 108, in accordance with some embodiments. In addition, as shown in FIG. 1C, a metal-semiconductor compound layer 228A is formed over the source/drain regions 220, and a metal-semiconductor compound layer 228B is formed over the gate structure 208, in accordance with some embodiments. The metal-semiconductor compound layers 128A, 128B, 228A and 228B may further decrease the on-resistance of the device.

In some embodiments of the present disclosure, each of the metal-semiconductor compound layers 128A, 128B, 228A and 228B is made of metal silicide, which is a metal-Si compound. In some embodiments, the metal silicide includes, but is not limited to, nickel silicide, cobalt silicide, tungsten silicide, titanium silicide, tantalum silicide, platinum silicide or erbium silicide.

In some embodiments, a blocking layer (not shown) is formed over the semiconductor substrate 102 and covers the portion where the formation of metal silicide is undesired. In some embodiments, the portion covered by the blocking layer will not contact metal to form metal silicide in the subsequent metal silicidation step. In some embodiments, the blocking layer exposes the top surface of the source/drain structure 120, the top surface of the gate structure 108, the top surface of the source/drain regions 220, and the top surface of the gate structure 208. In some embodiments of the present disclosure, the material of the blocking layer may include, but is not limited to, silicon oxide, silicon nitride, silicon oxynitride formed by chemical vapor deposition (CVD), any other suitable insulating materials, or a combination thereof.

Afterwards, a metal silicidation step is performed to form the metal-semiconductor compound layers 128A, 128B, 228A and 228B at the exposed top surfaces of the source/drain structure 120, the gate structure 108, the source/drain regions 220, and the gate structure 208, respectively.

As shown in FIG. 1C, the second doped region 124 is spaced apart or separated from the metal-semiconductor compound layer 128A by the third doped region 126, in accordance with some embodiments. As shown in FIG. 1C, the second doped region 124 does not come into contact with the metal-semiconductor compound layer 128A, in accordance with some embodiments.

In some cases, since the second doped region 124, which has the highest dopant concentration in the source/drain structure 120, is spaced apart from the metal-semiconductor compound layer 128A by the third doped region 126, the dopant in the second doped region 124 would not be redistributed to the metal-semiconductor compound layer 128A during the metal silicidation step, which in turn reduces or prevents defects that form in the metal-semiconductor compound layer 128A.

Figure 1D:
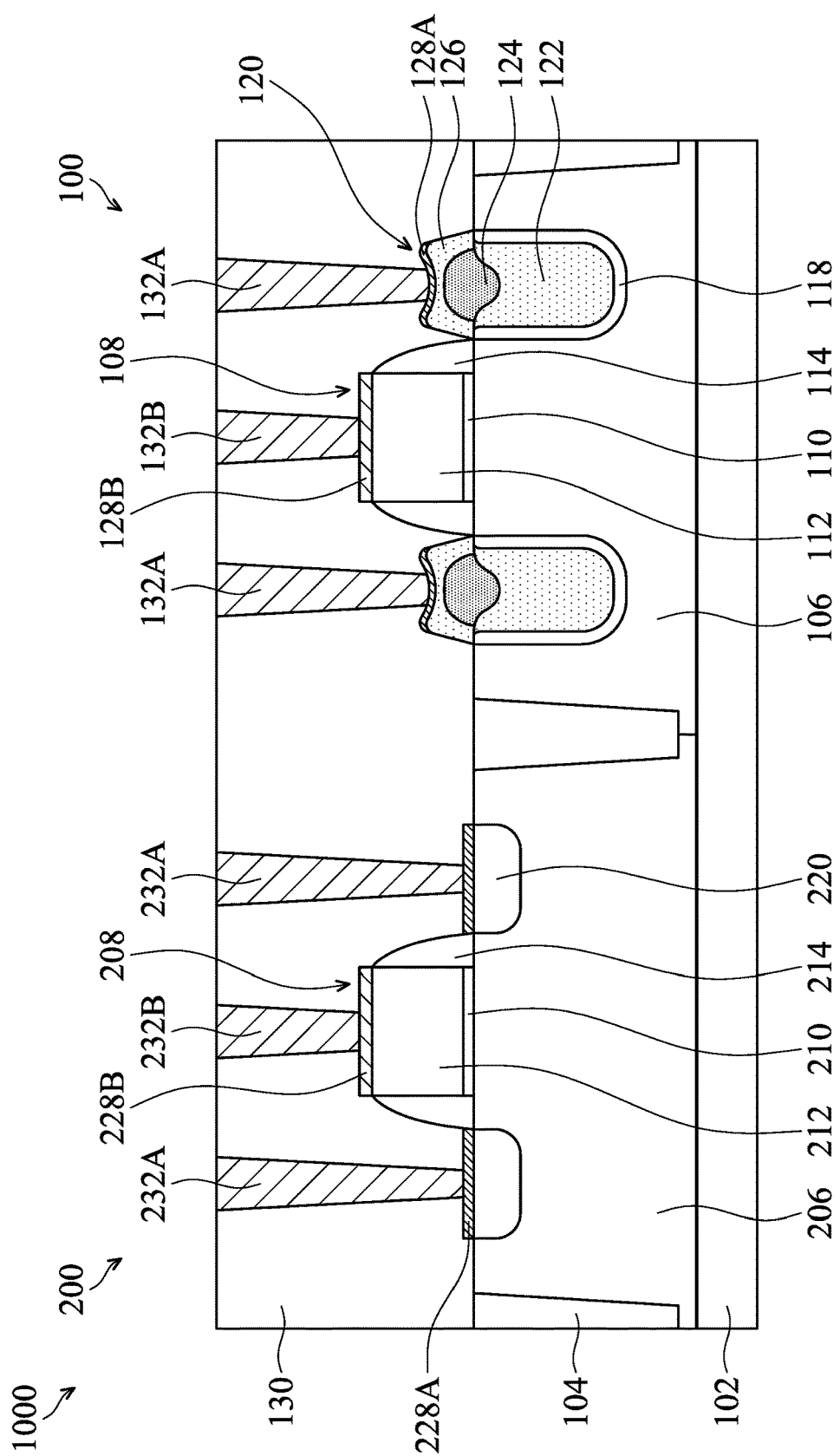

As shown in FIG. 1D, a dielectric layer 130 is formed over the gate structures 108 and 208, in accordance with some embodiments. In some embodiments, a dielectric material layer is deposited to cover the source/drain structures 120, the source/drain regions 220, the gate structures 108 and 208 and the metal-semiconductor compound layers 128A, 128B, 228A and 228B. In some embodiments, the dielectric material layer includes silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, contacts 132A, 132B, 232A and 232B are formed in the dielectric layer 130 to form the semiconductor device 1000. As shown in FIG. 1D, the two contacts 132A are respectively electrically connected to the two source/drain structures 120 at opposite sides of the gate structure 108 in the NMOS 100, in accordance with some embodiments. As shown in FIG. 1D, the contact 132A is in direct contact with the metal-semiconductor compound layers 128A over the source/drain structure 120, in accordance with some embodiments.

As shown in FIG. 1D, the contact 132A is aligned with the second doped region 124. In some cases, since the contact 132A is aligned with the second doped region 124, the contact resistance in the device may be reduced.

As shown in FIG. 1D, the contact 132B is electrically connected to the gate structure 108 in the NMOS 100, in accordance with some embodiments. As shown in FIG. 1D, the contact 132B is in direct contact with the metal-semiconductor compound layers 128B over the gate structure 108, in accordance with some embodiments.

As shown in FIG. 1D, the two contacts 232A are respectively electrically connected to the two source/drain structures 220 at opposite sides of the gate structure 208 in the PMOS 200. As shown in FIG. 1D, the contact 232A is in direct contact with the metal-semiconductor compound layers 228A over the source/drain regions 220, in accordance with some embodiments.

As shown in FIG. 1D, the contact 232B is electrically connected to the gate structure 208 in the PMOS 200, in accordance with some embodiments. As shown in FIG. 1D, the contact 232B is in direct contact with the metal-semiconductor compound layers 228B over the gate structure 208, in accordance with some embodiments.

In some embodiments of the present disclosure, each of the contacts 132A, 132B, 232A and 232B is made of a single layer or multiple layers of copper, aluminum, tungsten, gold, chromium, nickel, platinum, titanium, iridium, rhodium, an alloy thereof, a combination thereof, or any other conductive material.

In some embodiments of the present disclosure, openings are formed in the dielectric layer 130 to expose the metal-semiconductor compound layers 128A, 128B, 228A and 228B. In some embodiments, the formation of the openings includes patterning the dielectric layer 130 by a photolithography process, etching the exposed surface of the dielectric layer 130 (for example, by using a dry etching process, a wet etching process, a plasma etching process, or a combination thereof) to form the openings.

Afterwards, a conductive material layer is deposited over the dielectric layer 130 and fills into the openings. In some embodiments, the conductive material layer is deposited by using chemical vapor deposition (CVD), sputtering, resistive thermal evaporation, electron beam evaporation, or any other suitable methods.

Afterwards, a planarization process may be used to partially remove the conductive material layer. The conductive material layer may be partially removed until the dielectric layer 130 is exposed. As a result, the conductive material layer that remains in the openings forms the contacts 132A, 132B, 232A and 232B. In some embodiments, the planarization process includes a CMP process, a grinding process, a dry polishing process, an etching process, another applicable process, or a combination thereof.

In some embodiments, the materials of the contacts 132A, 132B, 232A and 232B are the same, and the contacts 132A, 132B, 232A and 232B are formed by the same conductive material deposited in the same deposition steps. However, in other embodiments, the contacts 132A, 132B, 232A and/or 232B may be formed of different conductive materials deposited in the different deposition steps, and the materials of one or more of the contacts 132A, 132B, 232A and 232B may be different from the others.

In some embodiments of the present disclosure, the semiconductor device 1000 is a complementary metal-oxide-semiconductor. In some embodiments of the present disclosure, as shown in FIG. 1D, the semiconductor device 1000 includes the N-type metal-oxide-semiconductor 100 and the P-type metal-oxide-semiconductor 200, in accordance with some embodiments.

Figure 2:
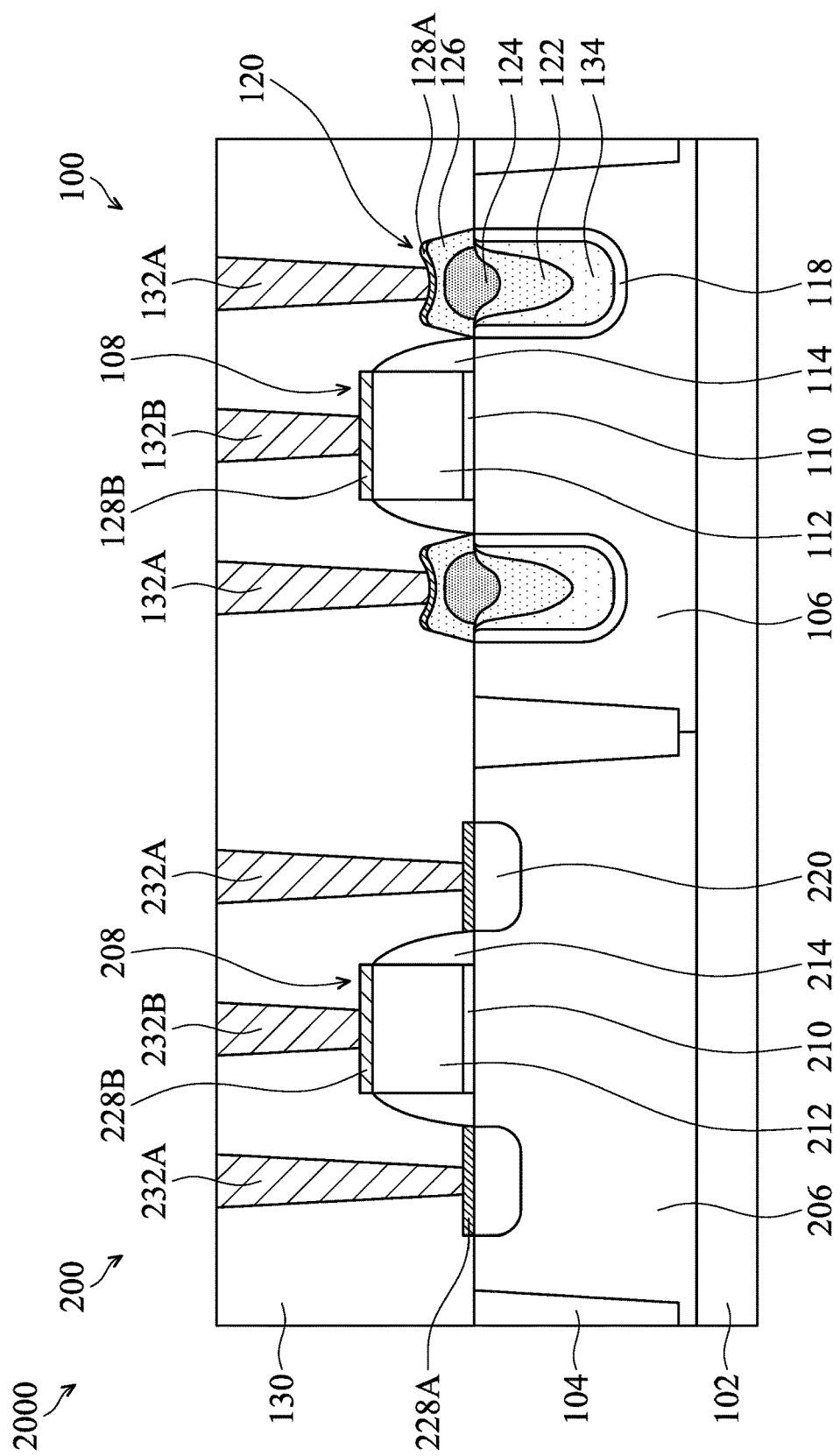
FIG. 2 is a cross-sectional view of a semiconductor device in accordance with some other embodiments of the present disclosure.

It should be noted that the exemplary embodiments set forth in FIGS. 1A-1D are merely for the purpose of illustration. In addition to the embodiments set forth in FIGS. 1A-1D, the source/drain structures have other configuration as shown in FIG. 2. This will be described in detail in the following description. Therefore, the inventive concept and scope are not limited to the exemplary embodiments set forth in FIGS. 1A-1D.

Note that the same or similar elements or layers corresponding to those of the semiconductor device are denoted by like reference numerals. The same or similar elements or layers denoted by like reference numerals have the same meaning and will not be repeated for the sake of brevity.

FIG. 2 is a cross-sectional view of a semiconductor device 2000 in accordance with some other embodiments of the present disclosure. The difference between the embodiment shown in FIG. 2 and the embodiment shown in FIG. 1D is that the source/drain structure 120 further includes a fourth doped region 134 between the liner layer 118 and the first doped region 122.

In some embodiments of the present disclosure, the dopant concentration of the fourth doped region 134 is between the dopant concentration of the liner layer 118 and the dopant concentration of the first doped region 122. In some embodiments of the present disclosure, the dopant concentration of the fourth doped region 134 is in a range from about $1\times10^{21}/cm^3$ to about $3\times10^{21}/cm^3$, for example about $2\times10^{21}/cm^3$.

In some cases, since the first doped region 122 is separated from the liner layer 118 by the fourth doped region 134 which has a dopant concentration between the dopant concentration of the liner layer 118 and the dopant concentration of the first doped region 122, the source/drain structure 120 may have a smoother dopant concentration gradient and the current leakage may be reduced further.

In addition, as shown in FIG. 2, the first doped region 122 does not come into contact with the liner layer 118, in accordance with some embodiments.

It should be noted that the exemplary embodiments set forth in FIGS. 1A-2 are merely for the purpose of illustration. In addition to the embodiments set forth in FIGS. 1A-2, the source/drain structure may include two or more doped regions (or doped layers) between the liner layer and the first doped region. In some embodiments of the present disclosure, these two or more doped regions have dopant concentrations between the dopant concentration of the liner layer and the dopant concentration of the first doped region. In addition, in some embodiments of the present disclosure, for every two adjacent doped regions, the dopant concentration of the one that is closer to the first doped region is higher than the dopant concentration of the one that is further away from the first doped region. Therefore, the inventive concept and scope are not limited to the exemplary embodiments set forth in FIGS. 1A-2.

In addition, it should be noted that the exemplary embodiments set forth in FIGS. 1A-2 are merely for the purpose of illustration. In some other embodiments, only one recess and one source/drain structure including the first doped region, the second doped region and the third doped region are formed at one side of the gate structure in the NMOS. In some embodiments of the present disclosure, an N-type source/drain region is formed at the other side of the gate structure in the NMOS. Therefore, the inventive concept and scope are not limited to the exemplary embodiments set forth in FIGS. 1A-1D or FIG. 2.

Embodiments of the disclosure use a source/drain structure with its heavily-doped region enclosed by the lightly-doped region. As a result, the current leakage from the heavily-doped region to the channel region may be reduced. In addition, dopant redistribution from the heavily-doped region to the metal-semiconductor compound layer may be prevented. Therefore, the quality and reliability of the semiconductor device are significantly improved.

In addition, although the doping concentrations of various doped regions in some embodiments have been described previously, one skilled in the art will recognize that the doping concentrations of various doped regions depend upon the specific device type, technology generation, minimum feature size, and the like. It is intended, therefore, that the doping concentrations of various doped regions may be interpreted in light of the technology being evaluated and not be limited to the described embodiments. In addition, in some other embodiments of the present disclosure, the semiconductor substrate includes one or more fin structures, and the NMOS and/or PMOS are formed over the one or more fin structures.

In accordance with some embodiments, a semiconductor device is provided. The semiconductor device includes a substrate, a gate structure over the substrate, and a first recess and a second recess in the substrate and at opposite sides of the gate structure. The semiconductor device also includes two source/drain structures over the first recess and the second recess respectively. At least one of the source/drain structures includes a first doped region partially filling in the first recess, a second doped region over the first doped region, and a third doped region over the second doped region. The second doped region contains more dopants than the first doped region or the third doped region.

In accordance with some embodiments, a semiconductor device is provided. The semiconductor device includes a substrate, a gate structure over the substrate, and a recess in the substrate and adjacent to the gate structure. The semiconductor device also includes a source/drain structure over the recess. The source/drain structure includes a first doped region partially filling in the recess, a second doped region over the first doped region, and a third doped region over the second doped region. The second doped region is enclosed by the first doped region and the third doped region.

In accordance with some embodiments, a semiconductor device is provided. The semiconductor device includes a substrate, a gate structure over the substrate, and a recess in the substrate and adjacent to the gate structure. The semiconductor device also includes a source/drain structure over the recess. The source/drain structure includes a first doped region partially filling in the recess, a second doped region over the first doped region, and a third doped region over the second doped region. The semiconductor device further includes a metal-semiconductor compound layer over the source/drain structure. The second doped region is separated from the metal-semiconductor compound layer by the third doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate structure over the semiconductor substrate; and
   a source/drain structure near the gate structure, wherein the source/drain structure comprises:
      a first semiconductor region;
      a second semiconductor region over the first semiconductor region;
      a third semiconductor region over the second semiconductor region, wherein the second semiconductor region is separated from a sidewall surface of the source/drain structure by the first semiconductor region, and the second semiconductor region has a greater average dopant concentration than that of the first semiconductor region and that of the third semiconductor region.

2. The semiconductor device as claimed in claim 1, wherein the source/drain structure further comprises a liner region between the semiconductor substrate and the first semiconductor region, the liner region has a smaller average dopant concentration than that of the first semiconductor region.

3. The semiconductor device as claimed in claim 2, wherein the source/drain structure further comprises a fourth semiconductor region between the liner region and the first semiconductor region, wherein the fourth semiconductor region has an average dopant concentration greater than that of the liner region, and the average dopant concentration of the fourth semiconductor region is smaller than that of the first semiconductor region.

4. The semiconductor device as claimed in claim 2, wherein the liner region surrounds sidewalls of the first semiconductor region.

5. The semiconductor device as claimed in claim 1, wherein a portion of the second semiconductor region protrudes from a surface of the semiconductor substrate.

6. A semiconductor device structure, comprising:
   a substrate;
   a gate structure over the substrate; and
   a source/drain structure near the gate structure, wherein the source/drain structure has an inner portion and an outer portion surrounding an entirety of the inner portion, the inner portion has a greater average dopant concentration than that of the outer portion.

7. The semiconductor device as claimed in claim 6, wherein the inner portion has a first average dopant concentration, the first average dopant concentration is in a range from about $3\times10^{21}/cm^3$ to about $5\times10^{21}/cm^3$, the outer portion has a second average dopant concentration, and the second average dopant concentration is in a range from about $2\times10^{21}/cm^3$ to about $4\times10^{21}/cm^3$.

8. The semiconductor device as claimed in claim 6, wherein the inner portion has a first average dopant concentration, the outer portion has a second average dopant concentration, a ratio of the first average dopant concentration to the second dopant concentration is in a range from about 1.3:1 to about 2:1.

9. The semiconductor device as claimed in claim 6, wherein the source/drain structure further comprises a liner region between the substrate and the outer portion, the liner region has a smaller average dopant concentration than that of the outer portion.

10. The semiconductor device as claimed in claim 9, wherein the source/drain structure further comprises a semiconductor region between the liner region and the outer region, wherein the semiconductor region has an average dopant concentration greater than that of the liner region, and the average dopant concentration of the semiconductor region is smaller than that of the outer region.

11. The semiconductor device as claimed in claim 6, wherein a top of the inner portion is higher than a bottom of the gate structure with respect to a bottom surface of the substrate.

12. The semiconductor device as claimed in claim 6, wherein a bottom of the inner portion is lower than a bottom of the gate structure with respect to a bottom surface of the substrate.

13. The semiconductor device as claimed in claim 6, wherein the inner portion becomes narrower along a direction towards a bottom surface of the substrate.

14. The semiconductor device as claimed in claim 6, wherein the outer portion becomes narrower along a direction towards a bottom surface of the substrate.

15. The semiconductor device as claimed in claim 6, wherein the inner portion is in direct contact with the outer portion.

16. The semiconductor device as claimed in claim 6, further comprising a conductive contact electrically connected to the source/drain structure, wherein the conductive contact is aligned with the inner portion.

17. The semiconductor device as claimed in claim 6, wherein the inner portion and the outer portion are n-type doped.

18. A method for forming a semiconductor device structure, comprising:
- forming a gate structure over a semiconductor material;
- partially removing the semiconductor material to form a recess near the gate structure;
- forming a first semiconductor region over a bottom surface and sidewalls of the recess;
- forming a second semiconductor region over the first semiconductor region, wherein the second semiconductor region is separated from the sidewalls of the recess by the first semiconductor region; and
- forming a third semiconductor region over the second semiconductor region, wherein the second semiconductor region has a greater average dopant concentration than that of the first semiconductor region and the third semiconductor region.

19. The method for forming a semiconductor device structure as claimed in claim 18, wherein the first semiconductor region, the second semiconductor region, and the third semiconductor region are formed using one or more epitaxial growth processes.

20. The method for forming a semiconductor device structure as claimed in claim 18, further comprising epitaxially growing a liner region along the bottom surface and the sidewalls of the recess before the first semiconductor region is formed.

* * * * *